United States Patent [19]
Krymski

[11] Patent Number: 6,147,519
[45] Date of Patent: Nov. 14, 2000

[54] LOW-VOLTAGE COMPARATOR WITH WIDE INPUT VOLTAGE SWING

[75] Inventor: Alexander I. Krymski, Montrose, Calif.

[73] Assignee: Photobit Corporation, Pasadena, Calif.

[21] Appl. No.: 09/173,982

[22] Filed: Oct. 16, 1998

Related U.S. Application Data

[60] Provisional application No. 60/063,750, Oct. 17, 1997.

[51] Int. Cl.[7] .............................. H03K 5/22; G05F 1/10
[52] U.S. Cl. ............................................ 327/65; 327/536
[58] Field of Search ..................................... 327/534, 535, 327/536, 537, 390, 65, 66, 589, 55, 57, 67

[56] References Cited

U.S. PATENT DOCUMENTS

| | | | |
|---|---|---|---|
| 5,572,158 | 11/1996 | Lee et al. | 327/175 |
| 5,719,525 | 2/1998 | Khoury | 327/562 |
| 5,805,021 | 9/1998 | Brehmer | 330/253 |
| 5,811,994 | 9/1998 | Ricotti et al. | 327/104 |

*Primary Examiner*—Toan Tran
*Attorney, Agent, or Firm*—Fish & Richardson P.C.

[57] ABSTRACT

A low voltage comparator for amplifying a voltage difference between a pair of differential inputs. A boost capacitor charges to a boost voltage in excess of the low supply voltage, a differential pair of MOSFET transistors, each said transistor including a gate, a source, a drain, and a body terminal. The comparator also includes a latch mechanism built from a cross-coupled pair of MOSFET transistors for latching the compared result. A well capacitor is used to charge the body terminal of the differential pair where the boost capacitor and the well capacitor boost the common source voltage and reduce the threshold voltage of the differential pair to allow the supply voltage to be at relatively low level.

27 Claims, 3 Drawing Sheets

LOW-VOLTAGE COMPARATOR WITH WIDE INPUT VOLTAGE SWING

CROSS-REFERENCE TO RELATED APPLICATIONS

This application claims benefit of the priority of U.S. Provisional Application Ser. No. 60/063,750, filed Oct. 17, 1997 and entitled "Low-Voltage Comparator with Wide Input Voltage Swing."

TECHNICAL FIELD

The invention relates to low-voltage operational amplifier ("op amp") circuits, and more particularly to low-voltage op amps in a differential pair configuration using MOSFET transistors.

BACKGROUND

Operational amplifiers are widely used in electronic circuits. The operational amplifiers are popular because they have characteristics that are desirable for voltage amplification. The operational amplifier circuits are characterized by high input impedance and low output impedance that allow extremely small input currents, and hence low power, to drive the circuit and relatively stable output for large current flow.

A pair of complimentary metal-oxide semiconductor (CMOS) transistors, including a p-channel MOS and an n-channel MOS, are used to further reduce the input power consumption. The CMOS transistors in field-effect configuration are called MOS field-effect transistors (MOSFET). The MOSFET transistors draw negligible current relative to bipolar transistors because the transistors are controlled at the gate terminal by an electric field rather than by current flow. The electrical current flows from the source terminal to the drain terminal of an n-channel MOSFET transistor when a voltage applied to the gate terminal has a higher value than the voltage applied to the source terminal. In a p-channel MOSFET transistor, the voltage applied to the gate terminal must be lower by a certain value than the voltage applied to the source terminal. This certain value is referred to as a threshold voltage. A threshold voltage of approximately 0.7 to 0.9 volts is required to form a conducting channel between the source and the drain terminals.

A comparator is a circuit whose output indicates which of its two input voltages is larger. The comparator senses small differences between the two input signal voltages and generates a digital output level indicating which input voltage corresponds to the differences.

FIG. 1 shows a comparator circuit 100 with two n-channel MOSFET transistors 106 and 108 configured as a differential amplifier. The p-channel MOSFET transistors 102 and 104 are configured in a cross-coupled pair with positive feedback.

A series of switches S1 through S2, implemented in practice with MOSFET transistors, are used to transition between modes. When the S1 switches are closed, the comparator circuit is in preset mode. The source and the drain terminals of the MOSFET transistors are set to supply voltage level ($V_{dd}$) and the transistors are turned off. When the S1 switches are opened and the S2 switch is closed, the circuit enters a differential amplifier comparator mode. Typical $V_{dd}$ is between 3.0 volts and 5.0 volts.

The circuit current, and thus the power, can be further reduced by lowering the reference voltage ($V_{dd}$) as much as possible. Lowering this voltage to 1.0 volt or lower would also allow the amplifier to operate from a single standard battery. However, the reference voltage cannot be reduced below the threshold voltage that is required to form a conducting channel between the source and the drain terminals. In general, the reference voltage cannot be reduced below 1.3 to 1.5 volts without significantly degrading the performance of the transistors.

SUMMARY

There is often a need to operate from a low voltage. For example, single battery cells often have voltages of about 1.5 volts. Solar cells also have relatively low voltages.

The present invention combines a voltage boosting system in combination with a corresponding boost in substrate voltages. This forms a comparator circuit can operate with the supply voltage reduced to approximately 1.0 volt. The substrate voltages are boosted when the PN junctions in p-channel MOSFET transistors are forward-biased.

The present disclosure describes a low voltage comparator for amplifying a voltage difference between a pair of differential inputs. The comparator includes a circuit for supplying a low voltage with correspondingly low current, a boost capacitor that charges to a boost voltage in excess of the low voltage, a differential pair of MOSFET transistors. Each one of the transistors includes a gate, a source, a drain, and a body terminal. The comparator also includes a latch mechanism built from a cross-coupled pair of MOSFET transistors for latching the compared result. A well capacitor is used to charge the body terminal of the differential pair. The boost capacitor and the well capacitor also boost the common source voltage and reduce the threshold voltage of the differential pair to allow the supply voltage to be at relatively low level.

In a preferred embodiment, the supply voltage is at approximately 1.0 volt. The boost capacitor is between 50 and 150 fF (1 fF=$10^{-15}$ F). The well capacitor is between 50 and 150 fF. In a further preferred embodiment, the differential pair is made from two p-channel MOSFET transistors with n-type wells while the cross-coupled pair is made from two n-channel MOSFET transistors with p-type substrates. In an alternative embodiment, a coupling capacitor is inserted between the substrates of the differential pair and the negative end of the boost capacitor to pull the body voltage up.

Other embodiments and advantages will become apparent from the following description and from the claims.

BRIEF DESCRIPTION OF THE DRAWINGS

These and other aspects of the invention will now be described with reference to the attached drawings, in which.

DETAILED DESCRIPTION

The present disclosure describes a low-voltage comparator 200 that has a booster structure to boost its source terminal voltages.

Figure 1:
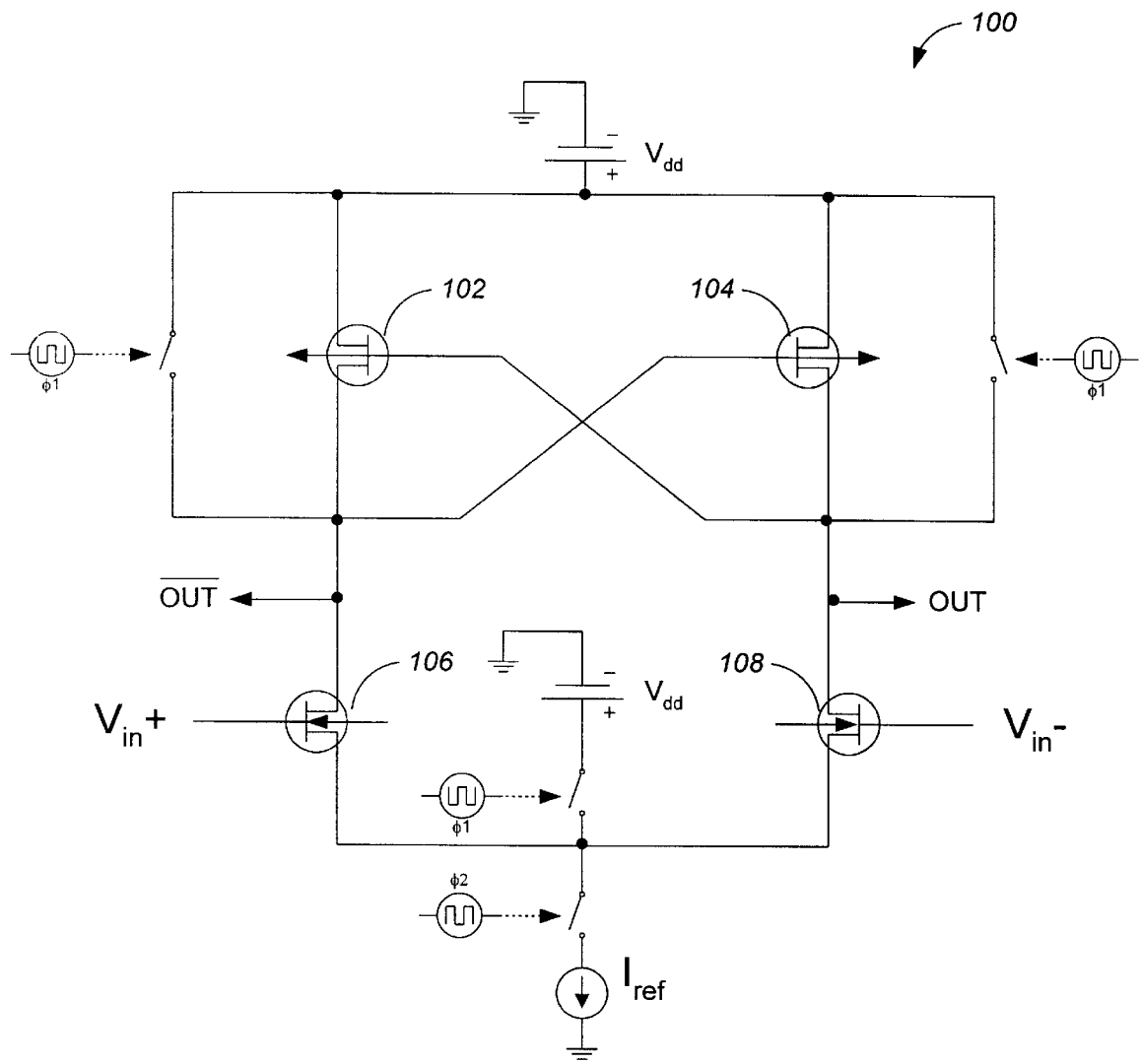
FIG. 1 is a schematic diagram of a typical prior art differential comparator.
Figure 2:
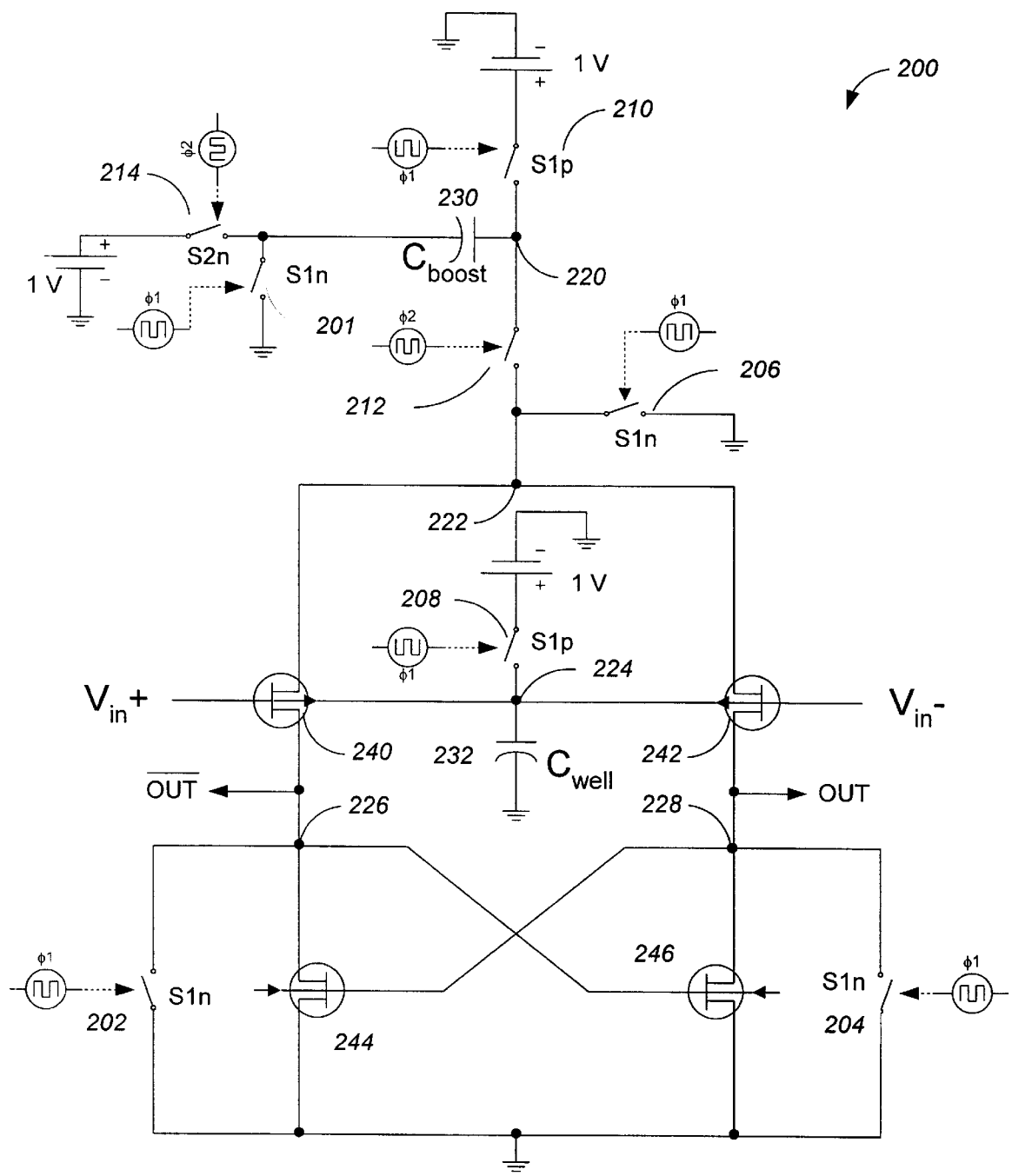
FIG. 2 is a schematic diagram of a preferred embodiment of the low-voltage comparator.

FIG. 2 is a schematic diagram of a preferred embodiment of a low-voltage comparator. The low-voltage comparator includes a number of advantageous features that allow the comparator to operate with lower supply voltage. The advantageous features include a forward bias increase element which allows the MOSFET to be operated with a lower forward bias voltage than would normally be possible.

A voltage boosting structure enables boosting the voltage from the actual supplied voltage to some higher voltage. A special technique involving substrates or wells of the MOSFET transistors and a capacitor tied to the common wells forward-biases the PN junctions and pulls the body terminals up. Hence, the voltage at the body terminal closely follows the boosted voltage.

The system operates with a series of switches controlled by two clocks, φ1 and φ2 which are out of phase with one another. These clocks are used to selectively open and close a number of the switches shown in the figure. The clock φ2 is an inversion of the clock φ1. The switches are used to transition between modes.

S1 switches are used during preset mode while the S2 switches are used during comparison mode. The switches are also labeled as n or p type. The switch types correspond to the channel type of MOSFET transistors that is used to create the switch. Therefore, for example, an S1p switch can be implemented, in practice, as a p-channel MOSFET transistor.

Voltages to be compared are applied to the input terminals $V_{in}^+$ and $V_{in}^-$. The circuit is preset when all the S1 switches 201 through 210 are closed and the S2 switches 212 and 214 are open. In preset mode, the internal nodes 221, 222, 226 and 228 are grounded. The floating well node 224 is charged to 1.0 volt, and the node 220 is also charged to 1.0 volt.

The low-voltage comparator 200 is configured as a differential amplifier with a pair of p-channel MOSFET transistors 240 and 242. Each of the two p-channel MOSFET transistors 240 and 242 has a threshold voltage between approximately 0.7 and 0.9 volts.

Transition to the comparison mode is made by opening all the S1 switches 201 through 210, and closing S2 switches 214 and 212. The boosting circuit operates as follows. At an initial time, the switches 201 and 210 are closed thereby charging the capacitor 230 to a 1.0 volt charge. At the same time, 1.0 volt is placed on the well capacitor 232 which drives the $C_{well}$ by closing the switch 208. The charge is subsequently boosted by opening the switches 201, 208 and 210. This pumps the charge out of the boost capacitor 230 that was charged to 1.0 volt during preset. This charge is additive to the node 220, and hence drives the voltage on node 220 up above the precharged 1 volt. The voltage on node 222 follows the voltage on node 220 because the switch 212 is closed. The node 222 is a common source terminal of the differential pair 240 and 242.

The comparison starts when the common source voltage of the differential pair approaches $V_{in}+V_{threshold}$ value of the transistor which has the smaller $V_{in}$. In this case the $V_{threshold}$ is between 0.7 and 0.9 volts. Before the common source voltage reaches that value ($V_{in}+V_{threshold}$), no drain current flows in either transistors 240 or 242. Hence, output nodes 226 and 228 are pulled to the ground.

When the common source voltage reaches that value ($V_{in}+V_{threshold}$), all the drain current will flow through the p-channel of the MOSFET transistor that has the higher $V_{in}$ value. Once that occurs, the node with the higher input gate voltage charges up to the level of the common source voltage minus the threshold voltage. This voltage level is well above the threshold voltage of the n-channel MOSFET transistors 244 and 246. Since each node 226 or 228 is tied to the cross-coupled gate of the n-channel MOSFET transistor, only the node corresponding to the higher input voltage is pulled to the ground.

The voltage boosting at the common source terminal 222 forward-biases the PN junctions of the p-channel MOSFET transistors 240 and 242. The forward biasing of the PN junctions allows the current to flow from the common source 222 to the body terminals 224 of the transistors 240 and 242. As a source to body voltage approaches 1.4 volts, the current into the substrate becomes substantial. The current flowing through the PN junctions charges the n-well 224 of the transistors 240 and 242. The voltage charged by the well capacitor 232 is pulled up above 1.0 volt. The charging of the well capacitor 232 and the subsequent boosting of the voltage at the n-wells allow the common source voltage to rise to about 2.0 volts without limitations.

The boosting of the voltages at the common source and the wells of the differential pair reduces the necessary bias voltage, and allows the comparator circuit to operate with a supply voltage as low as 1.0 volt. The input voltages can swing from 0 to 1.0 volt without being in a "dead zone" of the threshold voltage.

The embodiment saves power consumption by automatically adjusting the output current depending on the input signal. In a preferred embodiment, the energy consumption is almost independent of the input voltage and is less than $C_{boost}*V_{dd}^2$ per comparison. If the boosting capacitor 230 is 100 fF and $V_{dd}$ is equal to one volt, the energy consumption is 100 fJ per comparison. Measured at a data rate of 1 MHZ, the power consumption is only 100 nW per comparison.

Figure 3:
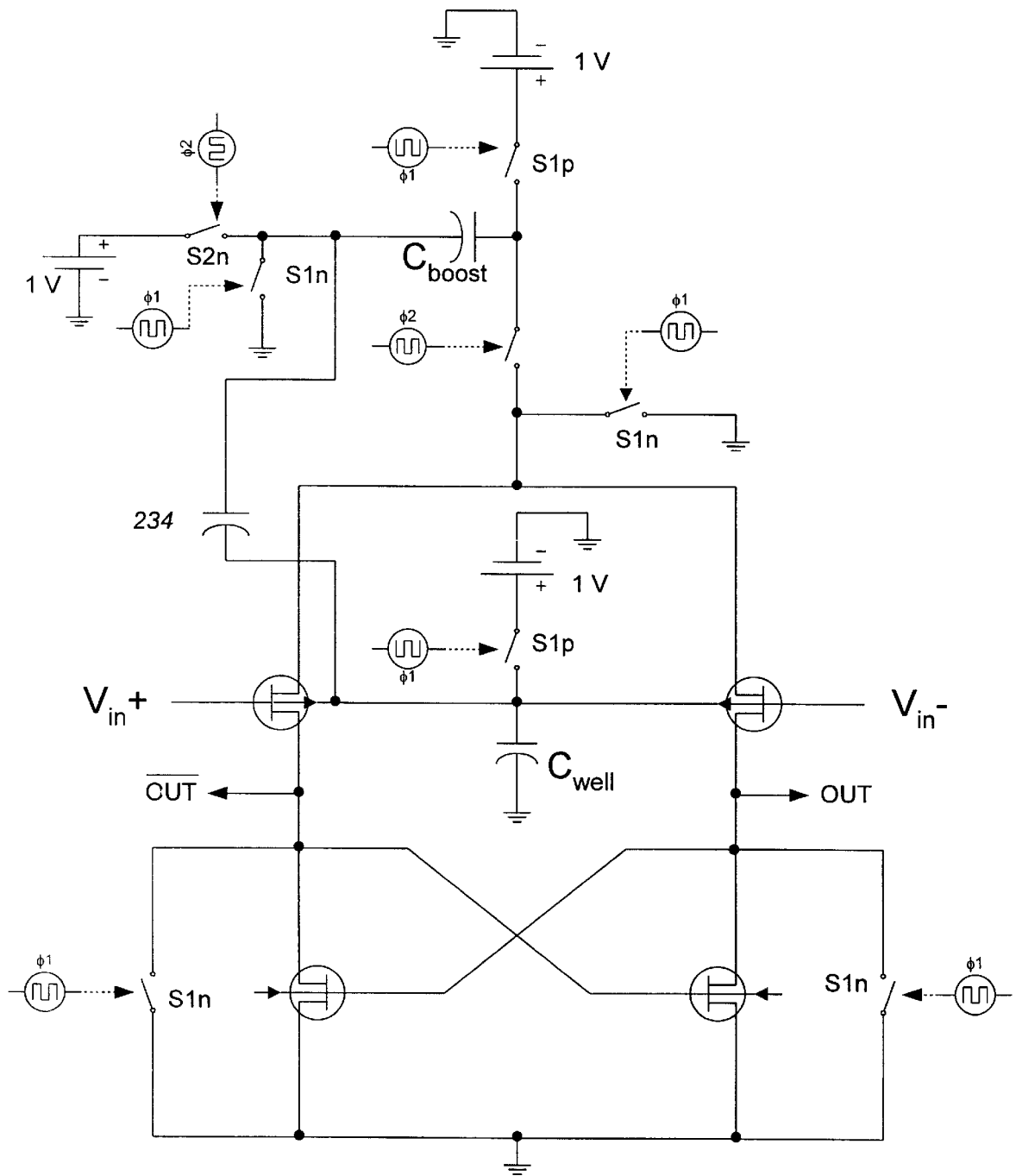
FIG. 3 is a schematic diagram of an alternative embodiment of the low-voltage comparator.

In an alternative embodiment shown in FIG. 3, a coupling capacitor 234 is inserted between the substrates of the differential pair and the negative plate of the boost capacitor. This coupling capacitor pulls the n-well voltage up during boosting and allows the boosted common source voltage at node 222 to go as high as 2.0 volts with limitations. This is an alternative way to pull the n-well voltage up during boosting.

A number of embodiments of the present invention have been described. Nevertheless, it will be understood that various modifications may be made without departing from the spirit and scope of the invention. For example, while the invention has been described in terms of p-channel MOSFET transistors in differential pair and n-channel MOSFET transistors in cross-coupled configuration, the dopants of the channels can be switched in the pairs. Accordingly, other embodiments are within the scope of the following claims.

What is claimed is:

1. A low-voltage comparator for amplifying a voltage difference between a pair of differential inputs, the comparator comprising:

a voltage source providing a voltage between first and second voltage levels;

a differential pair of transistors, each of said transistors including a gate, a source, a drain, and a body terminal, said differential pair of transistors configured to enable an output to change based on the relationship between its two inputs, one of said transistors including a well capacitor that charges the body terminal of the differential pair;

a boost capacitor configured to charge a common source node of said differential pair of transistors to a voltage above said first voltage level, wherein the boost capacitor and well capacitors boost said common source node thereby inducing a current through said differential pair.

2. The low voltage comparator of claim 1, further comprising switching elements operating to preset said comparator.

3. The low-voltage comparator of claim 1, wherein said first and second voltage levels are approximately 1.0 volt and 0.0 volt, respectively.

4. The low-voltage comparator of claim 1, wherein a value of the boost capacitor is between 50 and 150 fF.

5. The low-voltage comparator of claim 1, further comprising a cross-coupled pair of transistors coupled to said differential pair, said cross-coupled pair operating to buffer said output of said differential pair.

6. The low-voltage comparator of claim 1, wherein the differential pair of transistors are p-channel MOSFET transistors with n-type wells or substrates.

7. The low-voltage comparator of claim 5, wherein the cross-coupled pair of transistors are n-channel MOSFET transistors with p-type wells.

8. The low-voltage comparator of claim 1, wherein the differential pair of transistors are n-channel MOSFET transistors with p-type wells or substrates.

9. The low-voltage comparator of claim 5, wherein the cross-coupled pair of transistors are p-channel MOSFET transistors with n-type wells.

10. The low-voltage comparator of claim 1, further comprising a coupling capacitor placed between a terminal of the boost capacitor and the body terminal of the differential pair.

11. A low-voltage comparator for amplifying a voltage difference between a pair of differential inputs, the comparator comprising:

a power supply terminal, connected to receive a supply voltage;

a boost capacitor that charges to a boost voltage based on said supply voltage;

a differential pair of transistors having a common source terminal, each of said transistors including a gate, a source, a drain, and a body terminal;

a cross-coupled pair of transistors, connected to reinforce a current flow in said differential pair of transistors;

a well capacitor that charges said body terminal of the differential pair, said boost capacitor and well capacitor boosting a voltage at said common source terminal thereby inducing a current through said differential pair; and a plurality of switches which are switched to preset the comparator by grounding the source and the drain terminals of the differential pair and the cross-coupled pair of transistors.

12. The low-voltage comparator of claim 11, wherein said supply voltage is approximately 1.0 volt.

13. The low-voltage comparator of claim 11, wherein the value of the boost capacitor is between 50 and 150 fF.

14. The low voltage comparator of claim 11, wherein the value of the well capacitor is between 50 and 150 fF.

15. The low-voltage comparator of claim 11, wherein the differential pair is made from two p-channel MOSFET transistors with n-type wells or substrates.

16. The low-voltage comparator of claim 15, wherein the cross-coupled pair is made from two n-channel MOSFET transistors with p-type wells.

17. The low-voltage comparator of claim 11, wherein the differential pair is made from two n-channel MOSFET transistors with p-type wells or substrates.

18. The low-voltage comparator of claim 17, wherein the cross-coupled pair is made from two p-channel MOSFET transistors with n-type wells.

19. The low-voltage comparator of claim 11, further comprising a coupling capacitor placed between a terminal of the boost capacitor and the body terminal of the differential pair for boosting the body voltage.

20. A method of operating a comparator, comprising:

obtaining two transistors which require a first voltage drop for forward biased operation;

connecting said two transistors into a comparator, having input terminals which are connected to receive input voltages to be compared, and an output voltage indicating which of said input voltages has a higher level;

obtaining a power supply voltage which has a lower voltage than said first voltage drop; and using a forward bias increase element to allow said two transistors to operate with said power supply voltage.

21. The low-voltage comparator of claim 1, wherein said current through said differential pair induced by said boost and well capacitors enable decision making in said comparator.

22. The low-voltage comparator of claim 21, wherein said decision making is based on amount of said current divided into each transistor of said differential pair, said amount of said current in each transistor determined by said two inputs of said differential pair.

23. The low-voltage comparator of claim 2, wherein the switching elements are MOSFET transistors.

24. A comparator comprising:

a supply voltage supplying a voltage between first and second voltage levels;

a differential pair of transistors, each of said transistors having a gate, a source, a drain, and a body terminal, said differential pair configured to compare two input voltages at the gate terminals of said transistors, said source terminals of said transistors forming a common source terminal;

a pulse receiving element configured to receive a pulse of said supply voltage having an amplitude of difference between the first and second voltage levels;

a boost capacitor coupled to said common source terminal and said pulse receiving element, said boost capacitor charged to said first voltage level, said boost capacitor further charged when said pulse is received from said pulse receiving element, such that said common source terminal is boosted to approximately twice the first voltage level thereby inducing a current through said differential pair of transistors.

25. The comparator of claim 24, wherein said first and second voltage levels are approximately 1.0 volt and 0.0 volt, respectively.

26. The comparator of claim 24, wherein the body terminals of the differential pair of transistors are connected together to form a common body terminal.

27. The comparator of claim 26, further comprising:

a well capacitor coupled to said common body terminal and the pulse receiving element, said well capacitor operating to charge and boost said common body terminal.

* * * * *